United States Patent
Nakashima

(10) Patent No.: US 8,278,738 B2
(45) Date of Patent: Oct. 2, 2012

(54) METHOD OF PRODUCING SEMICONDUCTOR DEVICE AND SEMICONDUCTOR DEVICE

(75) Inventor: Hiroaki Nakashima, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 672 days.

(21) Appl. No.: 11/884,536

(22) PCT Filed: Feb. 8, 2006

(86) PCT No.: PCT/JP2006/002177
§ 371 (c)(1),
(2), (4) Date: Aug. 17, 2007

(87) PCT Pub. No.: WO2006/087957
PCT Pub. Date: Aug. 24, 2006

(65) Prior Publication Data
US 2008/0258267 A1 Oct. 23, 2008

(30) Foreign Application Priority Data

Feb. 17, 2005 (JP) ................. 2005-040556

(51) Int. Cl.
*H01L 29/40* (2006.01)
(52) U.S. Cl. .............. 257/621; 257/E23.174; 257/698; 257/774; 438/629; 438/667; 438/675
(58) Field of Classification Search .......... 257/E21.237, 257/E21.597, E23.174, E25.017, 621, 737, 257/774, 680, 510, 698, 686, 775, 781; 438/459, 438/667, 675, 629, 674
See application file for complete search history.

(56) References Cited

U.S. PATENT DOCUMENTS

| | | | | |
|---|---|---|---|---|
| 5,618,752 A * | 4/1997 | Gaul | ............................ | 438/626 |
| 6,239,495 B1 * | 5/2001 | Sakui et al. | .................. | 257/777 |
| 6,429,096 B1 * | 8/2002 | Yanagida | ..................... | 438/459 |
| 6,563,079 B1 * | 5/2003 | Umetsu et al. | ........... | 219/121.71 |
| 6,577,013 B1 * | 6/2003 | Glenn et al. | .................. | 257/777 |
| 6,608,371 B2 * | 8/2003 | Kurashima et al. | ........... | 257/686 |

(Continued)

FOREIGN PATENT DOCUMENTS

JP 10-223833 8/1998

(Continued)

OTHER PUBLICATIONS

English translation of the International Preliminary Report on Patentability mailed Aug. 30, 2007 in corresponding PCT Application No. PCT/JP2006/302177.

(Continued)

*Primary Examiner* — Chris Chu
(74) *Attorney, Agent, or Firm* — Nixon & Vanderhye P.C.

(57) ABSTRACT

A method of producing a semiconductor device which can reliably perform conductor filling to form a through hole electrode by a simple method is provided. A method of producing a semiconductor device of the present invention includes the steps of thinning a substrate from its back side in a state in which a first supporting body is attached to the front side of the substrate, removing the first supporting body from the substrate and attaching a second supporting body having an opening to the back side of the substrate, forming a through hole communicating with the opening of the second supporting body in the substrate before or after attaching the second supporting body, forming an insulating film within the through hole, and filling a conductor into the through hole of the substrate.

19 Claims, 12 Drawing Sheets

U.S. PATENT DOCUMENTS

| | | | |
|---|---|---|---|
| 6,703,310 B2 * | 3/2004 | Mashino et al. | 438/666 |
| 6,768,205 B2 * | 7/2004 | Taniguchi et al. | 257/774 |
| 6,809,421 B1 * | 10/2004 | Hayasaka et al. | 257/777 |
| 6,856,023 B2 * | 2/2005 | Muta et al. | 257/774 |
| 7,022,609 B2 * | 4/2006 | Yamamoto et al. | 438/694 |
| 7,102,219 B2 * | 9/2006 | Hanaoka et al. | 257/686 |
| 7,259,454 B2 * | 8/2007 | Tanida et al. | 257/698 |
| 7,276,738 B2 * | 10/2007 | Wada | 257/98 |
| 7,279,776 B2 * | 10/2007 | Morimoto | 257/621 |
| 7,282,444 B2 * | 10/2007 | Tanida et al. | 438/667 |
| 7,288,481 B2 * | 10/2007 | Nemoto | 438/667 |
| 7,365,440 B2 * | 4/2008 | Dotta | 257/781 |
| 7,375,007 B2 * | 5/2008 | Fukazawa | 438/459 |
| 7,397,128 B2 * | 7/2008 | Kubo et al. | 257/774 |
| 7,432,196 B2 * | 10/2008 | Tanida et al. | 438/667 |
| 7,485,967 B2 * | 2/2009 | Kameyama et al. | 257/774 |
| 7,494,925 B2 * | 2/2009 | Hiatt | 438/667 |
| 7,524,753 B2 * | 4/2009 | Sunohara et al. | 438/598 |
| 7,528,491 B2 * | 5/2009 | Kirby et al. | 257/774 |
| 7,582,971 B2 * | 9/2009 | Kameyama et al. | 257/774 |
| 7,605,080 B2 * | 10/2009 | Koizumi et al. | 438/667 |
| 2002/0125901 A1 | 9/2002 | Tanioka et al. | 324/754 |
| 2004/0016942 A1 * | 1/2004 | Miyazawa et al. | 257/200 |
| 2004/0212086 A1 | 10/2004 | Dotta et al. | 257/737 |
| 2005/0014311 A1 | 1/2005 | Hayasaka et al. | 438/109 |
| 2005/0017338 A1 | 1/2005 | Fukazawa | 257/686 |
| 2005/0266687 A1 * | 12/2005 | Morimoto | 438/667 |
| 2008/0272476 A1 * | 11/2008 | Do et al. | 257/686 |

FOREIGN PATENT DOCUMENTS

| | | |
|---|---|---|
| JP | 2004-319821 | 11/2004 |
| JP | 2004-327910 | 11/2004 |
| JP | 2005-026405 | 1/2005 |
| TW | 200507233 A | 2/2005 |

OTHER PUBLICATIONS

International Search Report for PCT/JP2006/302177 mailed May 2, 2006.

Taiwanese Office Action mailed Jul. 2, 2009 in corresponding Taiwanese application No. 095105417.

* cited by examiner

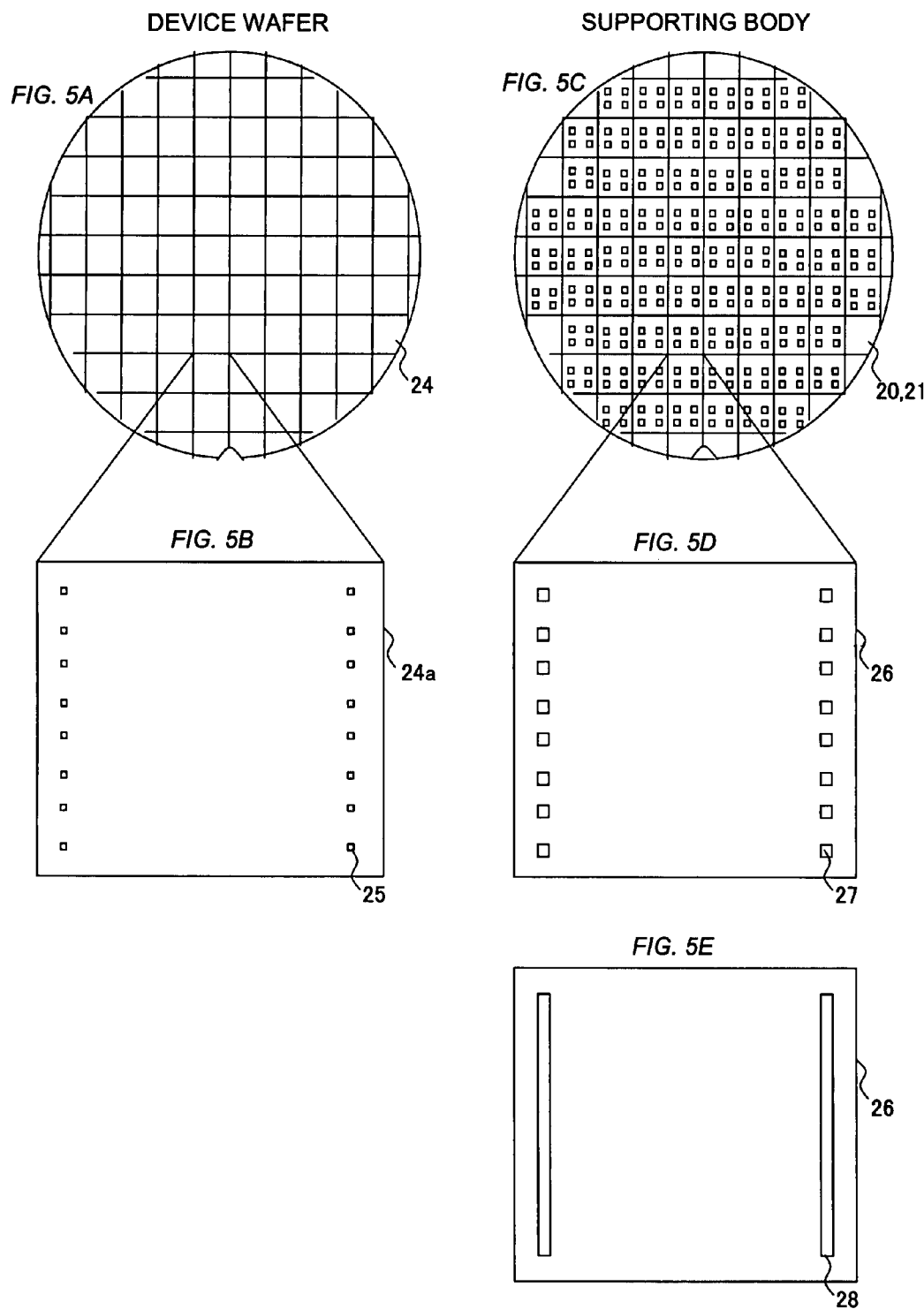

CONVENTIONAL ART

CONVENTIONAL ART

METHOD OF PRODUCING SEMICONDUCTOR DEVICE AND SEMICONDUCTOR DEVICE

This application is the US national phase of international application PCT/JP2006/302177 filed Feb. 8, 2006 which designated the U.S. and claims benefit of JP 2005-040556, dated Feb. 17, 2005, the entire content of which is hereby incorporated by reference.

TECHNICAL FIELD

The present invention relates to a method of producing a semiconductor device, and it can be suitably used for production of a thin semiconductor device having a through hole electrode.

BACKGROUND

In recent years, in line with the development of downsized and high-performance electronic devices such as computers and communication devices, a downsizing, a higher density and a speedup have been required of the semiconductor device. Therefore, semiconductor devices referred to as a three-dimensional chip formed by stacking a plurality of semiconductor chips, which are downsized and become high-density, are proposed. As a method of stacking a plurality of chips, a method shown in Japanese Unexamined Patent Publication No. 10-223833 is proposed.

Here, steps of producing a conventional semiconductor device will be described by use of FIG. 7. FIGS. 7A to 7J are sectional views of a semiconductor device showing a production process of a conventional semiconductor device.

First, a circuit component portion 51 is formed on the front side of a substrate 50 to obtain a structure shown in FIG. 7A. Next, a photoresist layer is formed by applying a photoresist onto the front side of the substrate 50, and a mask layer 52 having an opening 52a is formed by patterning this photoresist layer. Next, the circuit component portion 51 and the substrate 50 composed of a silicon wafer is etched by reactive ion etching (RIE) using the mask layer 52 to form a blind hole 53 with a depth of a little less than 100 μm below the surface of the substrate to obtain a structure shown in FIG. 7B. Next, an insulating film 54 is formed on the inner wall of the blind hole 53 to obtain a structure shown in FIG. 7C. Next, a seed layer 55 to become a cathode of electrolytic plating is formed on the insulating film, and this seed layer is used as a cathode and the inside of the blind hole 53 is filled with metal 56 to obtain a structure shown in FIG. 7D. Next, excess metal outside of the blind hole 53 is removed by chemical and mechanical polishing (CMP) of metal 56 to obtain a structure shown in FIG. 7E. Next, a supporting body 58 is bonded to the circuit component portion 51 side of the substrate 50 with a adhesive layer 57 consisting of a double-faced tape therebetween, and the backside of the substrate 50 is ground to expose metal 56 filled into the blind hole 53 to the backside of the substrate to obtain a structure shown in FIG. 7F. Next, the backside of the substrate 50 is selectively etched to obtain a structure shown in FIG. 7G. Next, an insulating film 59 of SiN or $SiO_2$ is deposited on the backside of the substrate 50 by a chemical vapor deposition (CVD) method to obtain a structure shown in FIG. 7H. Next, the insulating film 59 is removed to expose the metal 56 in the through-hole electrode using a CMP method to obtain a structure shown in FIG. 7I. Next, the supporting body 58 and the adhesive layer 57 are removed to obtain a structure shown in FIG. 7J.

A semiconductor device having a through-hole electrode can be produced by the above-mentioned steps.

In the above-mentioned production method, after the blind hole is filled with metal by electrolytic plating, metal is exposed to the backside of the substrate by thinning a Si substrate, and thereby a through-hole electrode is formed. But, when this method is used, a plating solution is hardly supplied to the bottom of the blind hole in filling the metal into the blind hole, and the metal filling is not completely performed due to hydrogen produced in electrolytic plating and voids tend to be generated. And, in order to perform complete filling, a complicated and sophisticated plating method using an additive is required and a plating time becomes longer. Consequently, there is a problem that a process cost increases.

SUMMARY OF THE INVENTION

The present invention has been made, at least in part, in view of the above state of the art, it is an object of the present invention to provide a method of producing a semiconductor device which can reliably perform conductor filling to form a through hole electrode by a simple method.

A method of producing a semiconductor device according to an aspect of the present invention is characterized by comprising the steps of thinning a substrate from its back side in a state in which a first supporting body is attached to the front side of the substrate, removing the first supporting body from the substrate and attaching a second supporting body having an opening to the back side of the substrate, forming a through hole communicating with the opening of the second supporting body in the substrate before or after attaching the second supporting body, forming an insulating film within the through hole, and filling a conductor into the through hole of the substrate.

Since the substrate is thinned in a state in which the substrate is supported by the first supporting body, the breakage of the substrate during thinning the substrate can be prevented. Also when in a state in which the substrate is supported by the second supporting body having an opening, a conductor is filled into the substrate through hole communicating with the opening. There, since a plating solution moves smoothly in the through hole during filling by an electrolytic plating method, filling of the through hole is easily performed, and hydrogen produced in the electrolytic plating is easily removed.

BRIEF DESCRIPTION OF THE DRAWINGS

FIG. 5A to FIG. 5E are plan views illustrating shapes of device wafer and second supporting body being examples of the present invention.

Figure 1A:
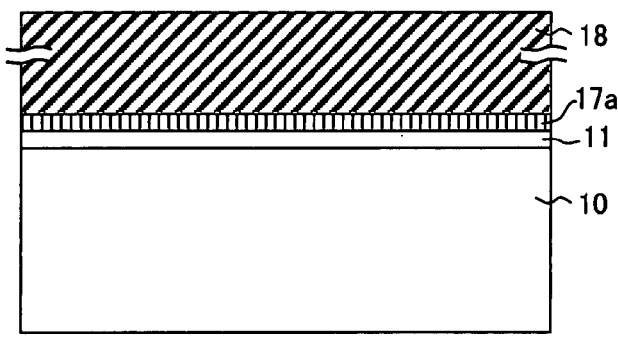
FIG. 1A to FIG. 1I are sectional views of a semiconductor device showing a production process of a semiconductor device of Example 1 of the present invention.

DESCRIPTION OF SYMBOLS 10, 50 semiconductor substrate
11, 51 circuit component portion
11a metal wiring layer
12, 52 photoresist
13, 53 through hole
14 second insulating film
15, 55 seed layer
16, 56 conductor
17a, 17b, 57 adhesive layer
18 first supporting body
19 first insulating film
20, 21, 22 second supporting body
20a, 21a, 22a opening of a second supporting body
23 groove
24 device wafer
24a device chip
25 through hole of a device wafer
26 portion in a supporting body corresponding to a device chip
27, 28 opening of a second supporting body
54, 59 insulating film
58 supporting body

DETAILED DESCRIPTION OF THE INVENTION

A method of producing a semiconductor device according to an aspect of the present invention is characterized by comprising the steps of thinning a substrate from its back side in a state in which a first supporting body is attached to the front side of the substrate, removing the first supporting body from the substrate and attaching a second supporting body having an opening to the back side of the substrate, forming a through hole communicating with the opening of the second supporting body in the substrate before or after attaching the second supporting body, forming an insulating film within the through hole, and filling a conductor into the through hole of the substrate.

The present invention can be implemented in various embodiments described below.

1. First Embodiment

A method of producing a semiconductor device of the first embodiment of the present invention is characterized by comprising the steps of attaching a first supporting body to the front side of the substrate, thinning the substrate from its back side, removing the first supporting body from the substrate, attaching a second supporting body having an opening to the backside of the substrate, forming a first insulating film on the front side of the substrate, forming a through hole communicating with the opening of the second supporting body in the substrate, forming a second insulating film within the through hole of the substrate, and filling a conductor into the through hole of the substrate.

The steps included in this embodiment does not always have to be implemented in the order described, an embodiment in which the steps are appropriately permuted or an embodiment in which a plurality of steps are simultaneously performed also constitutes the present invention.

1-1. Step of Attaching First Supporting Body

In this step, the first supporting body is attached to the front side of the substrate. A material, a thickness and a shape of the first supporting body is not particularly limited, but the first supporting body which is attached to the substrate and has enough rigidity to support the substrate is preferred. The first supporting body can be formed from various materials such as a semiconductor (silicon, etc.), a resin and glass. The outside shape of the first supporting body is not particularly limited, but a first supporting body having the outside shape (an area) equal to or larger than the substrate is preferred to ensure to support the substrate. The substrate is made of a semiconductor silicon such as a silicon substrate or the like and preferably has a thickness of about 300 to 700 μm.

The first supporting body can be attached to the substrate with an adhesive layer therebetween. The adhesive layer can be formed from an ultraviolet curable adhesive, a thermosetting adhesive, and a double-faced tape. The first supporting body may be attached to the substrate by an electrostatic force. Attachment of the first supporting body to the substrate may be performed by providing adhesive layers on whole opposite sides of the first supporting body and the substrate, or may be performed by providing adhesive layers only on partial opposite sides (for example, a central portion and a peripheral portion). As long as the substrate is supported by the first supporting body, the attachment of the first supporting body may be performed by any other method. Incidentally, generally, a circuit component portion is formed on the front side of the substrate before attaching the first supporting body. The circuit component portion is generally composed of semiconductor elements such as a transistor, a diode, resistance, a capacitance and an inductor, and wirings electrically connecting between semiconductor elements. A method of forming the circuit component portion is not particularly limited, and the circuit component portion can be formed by common semiconductor process.

1-2. Step of Thinning Substrate

In this step, the substrate is thinned from its back side. A method of thinning a substrate is not particularly limited, and the substrate can be thinned by, for example, mechanical grinding, chemical polishing, plasma etching or gas etching, or a combination technique of two or more of them. And, in order to prepare a low-profile semiconductor device, thinning of the substrate is preferably performed in such a way that a thickness of the substrate becomes 30 to 100 μm. Even if the substrate is thinned to such a thickness, it resists damage since it is supported by the first supporting body during thinning.

1-3. Step of Removing First Supporting Body

In this step, the first supporting body is removed from the substrate. The removal of the first supporting body is performed after thinning the substrate. And, if an adhesive is used in attaching the first supporting body to the substrate, the adhesive is also removed in this step.

1-4. Step of Attaching Second Supporting Body

In this step, the second supporting body having an opening is attached to the back side (the side opposite to the side to which the first supporting body is attached) of the substrate. The second supporting body is preferably attached after the removal of the first supporting body. The reason for this is that if the second supporting body is attached before the removal of the first supporting body, the second supporting body can be detached in removing the first supporting body. However, the second supporting body can be attached before the removal of the first supporting body by appropriately contriving materials of an adhesive and a double-faced tape used for attaching the second supporting body to the substrate to make the second supporting body unlikely to be detached in removing the first supporting body.

In the second supporting body, a material and a shape identical to those of the first supporting body can be employed. And, the second supporting body can be attached to the substrate by the same method as in the first supporting body. However, the material, the shape and the method of attaching of the second supporting body may be different from those of the first supporting body. The second supporting body has an opening. The opening may be mechanically formed by use of a needle or the like, or may be formed by a photolithography technique and an etching technique.

1-5. Step of Forming First Insulating Film

In this step, the first insulating film is formed on the front side of the substrate. The first insulating film can be formed from materials generally used in the pertinent field and by methods generally used in the pertinent field. The first insulating film is made of, for example, a silicon oxide film or a silicon nitride film. In this case, the first insulating film can be formed by, for example, a CVD method. And, the first insulating film may be formed by spin coating of a resin such as polyimide or epoxy, or may be formed by electrodeposition of polyimide. By forming the first insulating film on the front side of the substrate prior to the step of forming the substrate through hole, the contamination of the front side of the substrate can be prevented. The step of forming the first insulating film may be performed after the step of forming the substrate through hole, and in this case, the step of forming the first insulating film and the step of forming the second insulating film may be performed simultaneously. In this case, the insulating film can be formed both on the front side of the substrate and within the substrate through hole in one step, and the number of steps can be reduced. Further, when the first insulating film is unnecessary, this step does not have to be performed.

1-6. Step of Forming Substrate Through Hole

In this step, the through hole communicating with the opening of the second supporting body is formed in the substrate. The size of the through hole in the substrate is not particularly limited, but it is preferably smaller than the size of the opening of the second supporting body. The reason for this is that in this case, a plating solution moves smoothly in the through hole in the step of performing conductor filling. A profile of a lateral cross-section (plane in parallel with the surface of the substrate) of the through hole may be a square, a rectangle or a circle. The through hole can be formed by forming a resist pattern on the front side of the substrate or the backside of the substrate (i.e., on the second supporting body), and etching the substrate by use of this resist pattern as an etching mask. And, the through hole may be formed by etching the substrate using the second supporting body having an opening as a mask. When the second supporting body is used as a mask, there are advantages that a photomask for forming the resist pattern becomes unnecessary and alignment of the resist pattern with the opening of the second supporting body becomes unnecessary.

The formation of the substrate through hole can be performed before or after attaching the second supporting body. When the substrate through hole is formed before attaching the second supporting body, the second supporting body is positioned to the substrate through hole in such a way that the opening of the second supporting body communicates with the substrate through hole in attaching the second supporting body.

1-7. Step of Forming Second Insulating Film

In this step, the second insulating film is formed within the through hole of the substrate. The second insulating film can be formed from materials generally used in the pertinent field and by methods generally used in the pertinent field. The second insulating film can be formed using a material, a method, and a film thickness, which are different from or identical to the first insulating film.

1-8. Step of Performing Conductor Filling

In this step, the conductor is filled into the through hole of the substrate. A method of filling the conductor into the substrate through hole is not particularly limited, and this filling can also be performed by a CVD method or a sputtering method. However, conductor filling is preferably performed by forming a conductor seed layer within the through hole and performing conductor filling by an electrolytic plating method using this seed layer. The reason for this is that, since a plating solution moves smoothly in the through hole, filling of the through hole is easily performed, and hydrogen produced in the electrolytic plating is easily removed. In this case, the conductor is preferably made of copper or alloy including copper, but other metal may be used as long as it can be used for filling by an electrolytic plating method. And, generally, after performing conductor filling, the conductor outside of the blind hole (for example, the conductor on the front side of the substrate) is removed by a CMP method. The conductor seed layer can be formed by a CVD method or a sputtering method, and a thickness of the seed layer is preferably between a thickness of a monoatomic layer and 200 nm. The reason for this is that if the seed layer has a thickness of this level, it adequately functions as a seed layer for electrolytic plating. And, the conductor seed layer is preferably formed within the through hole via a barrier layer. The barrier layer is a layer having a function of preventing a conductor atom from diffusing into the substrate. By forming the barrier layer, the contamination of the substrate due to the conductor atom can be prevented. The barrier layer is made of TiN or TaN and can be formed by a CVD method or a sputtering method.

1-9. Step of Removing Second Supporting Body

The method may further comprise the step of removing the second supporting body from the substrate. When the second supporting body is attached to the substrate with an adhesive layer therebetween, the adhesive layer is also removed in this step. In addition, the second supporting body does not have to be removed if it is not in the way.

2. Second Embodiment

A method of producing a semiconductor device of the second embodiment of the present invention is characterized by comprising the steps of attaching a first supporting body to the front side of the substrate, thinning the substrate from its back side, removing the first supporting body from the substrate, attaching a second supporting body having an opening larger than a through hole to be formed in the substrate to the backside of the substrate, forming a first insulating film on the front side of the substrate, forming a through hole communicating with the opening of the second supporting body in the substrate, forming a groove on the backside of the substrate, forming a second insulating film within the groove and the through hole of the substrate, and filling a conductor into the groove and the through hole of the substrate.

The description about the first embodiment holds true for this embodiment as long as it is not against its purport.

This embodiment is different from the first embodiment in that the second supporting body has an opening larger than a through hole formed in the substrate and this embodiment comprises the step of forming a groove on the backside of the substrate. The groove on the backside of the substrate is preferably formed by using the second supporting body as a mask, but it may be formed by forming a resist pattern on the backside of the substrate, and using this resist pattern as a mask. Furthermore, by filling the conductor into the groove and the through hole formed in the substrate, a semiconductor device having a groove wiring and a through-hole electrode can be produced.

3. Third Embodiment

A semiconductor device of the third embodiment of the present invention comprises a circuit component portion formed on the front side of a substrate, a through hole piercing the substrate and the circuit component portion, an insulating film formed on the side face of the through hole in the substrate and the circuit component portion as well as on the front side of the circuit component portion, a conductor filled into the through hole, and a conductive layer extending from the backside of the substrate to the front side of the circuit component portion.

The description about the above-mentioned embodiment holds true for this embodiment as long as it is not against its purport. Such the semiconductor device can be produced by employing the above-mentioned method of producing a semiconductor device. The semiconductor device of the present invention can protect the circuit component portion since it has the insulating film on the front side of the substrate.

Hereinafter, examples of the present invention will be specifically described.

EXAMPLE 1

FIG. 1 is a sectional view of a semiconductor device showing a production process of a semiconductor device of Example 1. Hereinafter, this example will be described by way of FIG. 1.

1. Step of Attaching First Supporting Body

First, the circuit component portion 11 having certain functions is formed on the substrate 10. Next, the first supporting body 18 is attached to the front side (the side on which the circuit component portion 11 is formed) of the obtained substrate with an adhesive layer 17a consisting of an adhesive therebetween to obtain a structure shown in FIG. 1A. The first supporting body 18 is a silicon plate having a diameter of 8 inches and a thickness of about 300 to 700 μm, preferably 500 μm, and the first supporting body 18 has the same size as the substrate 10. Attaching of the first supporting body 18 to the substrate 10 can be performed by applying, for example, an adhesive of a polyimide resin to the substrate in a thickness of 100 μm, pressing the first supporting body 18 against the substrate across this adhesive, and heat-treating the adhesive at 310° C. for 30 minutes in this state to cure the adhesive. And, as the adhesive, an ultraviolet curable adhesive may be used, and when this ultraviolet curable adhesive is used, the adhesive is applied to the substrate in a thickness of 100 to 200 μm, and the first supporting body 18 is pressed against the substrate across this adhesive, and the adhesive is heated to a temperature of 100 to 150° C. and cured by irradiation of ultraviolet rays in this state. And, a double-faced tape may be used in place of the adhesive.

2. Step of Thinning Substrate

Figure 1B:
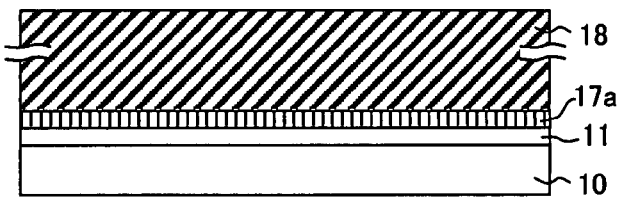

Next, the back side of the substrate 10 is receded in a state in which the first supporting body 18 is attached to the front side of the substrate to obtain a structure shown in FIG. 1B. Here, the recession of the substrate 10 is performed by use of a processing technology such as mechanical grinding, chemical polishing, plasma etching or gas etching. As for processing conditions, for example in mechanical grinding, a grindstone of the order of #300 to #200 is used as rough grinding, and after this grinding, finishing grinding is performed with a grindstone of the order of #2000. The number of revolutions of the grindstone is set at 2000 to 3000 rpm/min. A thickness of the receded substrate 10 is preferably 30 to 100 μm.

3. Step of Removing First Supporting Body

Next the first supporting body 18 on the front side of the circuit component portion 11 is removed. The removal of the first supporting body 18 is performed by immersing the substrate in a release solution such as monoethanolamine or dimethylformamide at about 120° C. to remove the adhesive layer 17a.

4. Step of Attaching Second Supporting Body

Next, the second supporting body 20 having an opening 20a is attached to the back side of the obtained substrate with an adhesive layer 17b consisting of an adhesive therebetween. A diameter, a thickness and a material of the second supporting body 20, and a method of attaching the second supporting body 20 to the substrate are the same as those of the first supporting body 18. The second supporting body 20 has an opening 20a, and a diameter of the opening 20a is larger than that of the through hole formed in the substrate 10 in a subsequent step and about 10 to 100 μm. The appearance of the second supporting body is as shown in FIG. 5C and the second supporting body has many openings.

5. Step of Forming First Insulating Film

Figure 1C:
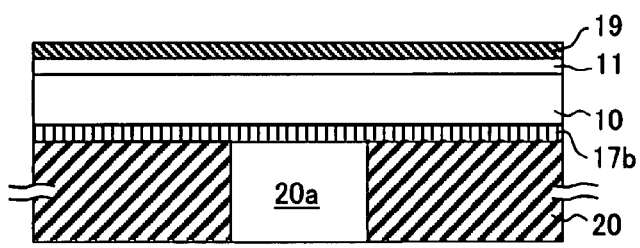
Figure 1D:
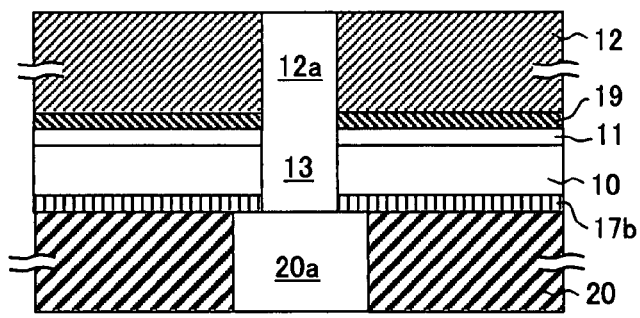

Next, the first insulating film 19 having a thickness of 100 to 5000 nm is formed on the front side of the substrate 10 to obtain a structure shown in FIG. 1C. The first insulating film 19 is made of a silicon oxide film or a silicon nitride film and is formed by, for example, a plasma CVD method. In the case of silicon oxide film, the insulating film is formed under the conditions that gas: TEOS 680 mg/$O_2$ 650 cc, pressure: 8.5 Torr, power: 800 W, and temperature: 50 to 100° C. And, the first insulating film 19 may be formed in a thickness of 100 to 5000 nm by spin-coating a resin such as polyimide or epoxy at a rotational speed of 1000 to 5000 rpm/min. Further, the first insulating film 19 may be a lamination type insulating film formed by laminating the silicon oxide film and the silicon nitride film in this order. A film thickness of the lamination type insulating film is 100 to 5000 nm, and a film thickness of the silicon nitride film of the lamination type insulating film is about 20 to 500 nm.

Figure 7A:
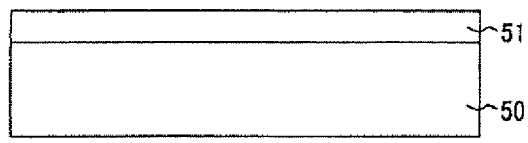
FIG. 7A to FIG. 7J are sectional views of a semiconductor device showing a production process of a conventional semiconductor device.
Figure 7B:
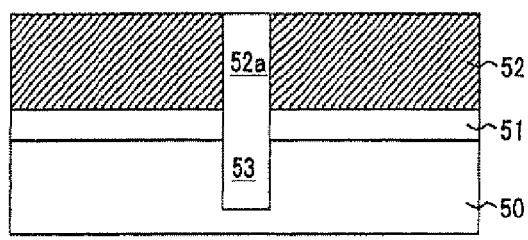
Figure 7C:
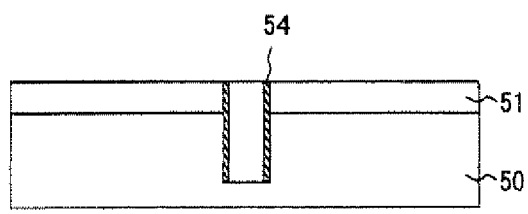
Figure 7D:
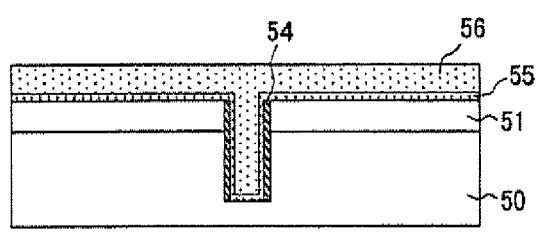
Figure 7E:
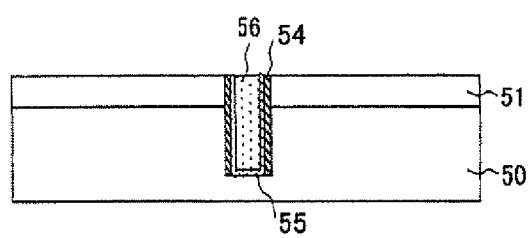
Figure 7F:
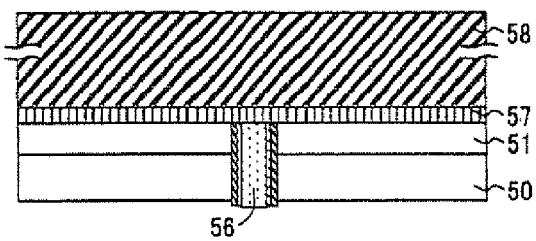
Figure 7G:
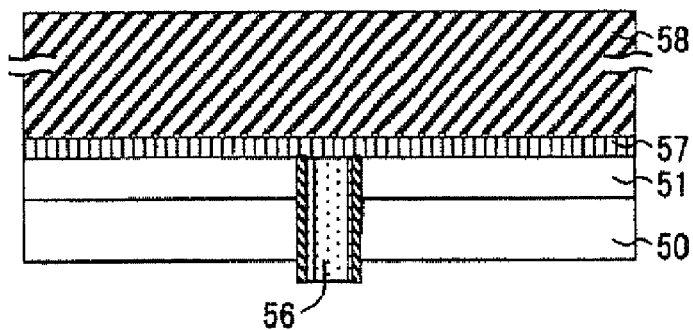
Figure 7H:
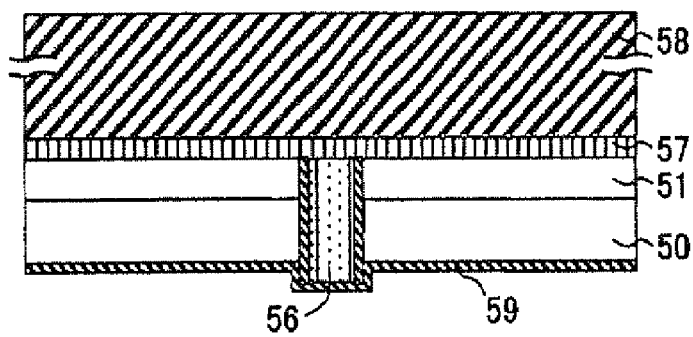
Figure 7I:
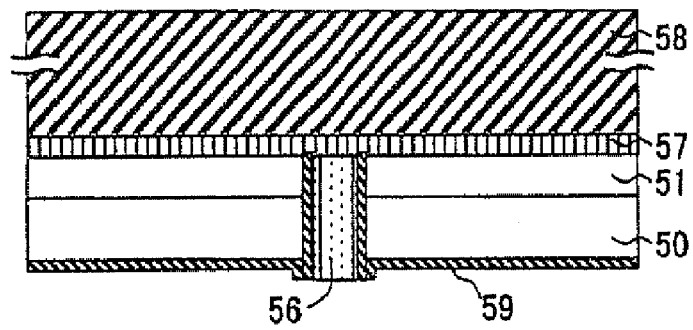
Figure 7J:
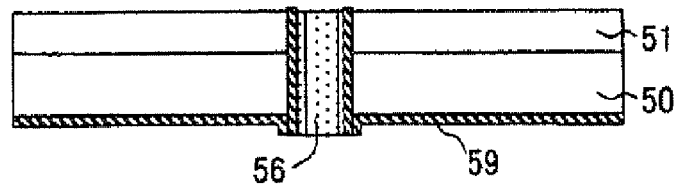

In this example, the first insulating film 19 is formed on the front side of the substrate 10. If the insulating film is formed on the backside of the substrate, or the side to which thinning of the substrate is applied, like a conventional technology (refer to FIG. 7H), there may be cases where the surface after thinning is not flat and the insulating film is not formed uniformly, but when the insulating film is formed on the front side of the substrate like this example, the insulating film is easy to be formed uniformly.

And, in this example, the insulating film is formed prior to the step of performing copper filling in contrast to the prior art. Therefore, it is not necessary to consider that an apparatus for forming an insulating film is contaminated with copper, and there is an advantage that a dedicated apparatus is unnecessary.

6. Step of Forming Substrate Through Hole

Next, the photoresist layer is formed by applying a photoresist onto the first insulating film 19 on the front side of the substrate 10, and the mask layer 12 having an opening 12a corresponding to the through hole to be formed in the substrate 10 is formed by patterning this photoresist layer. Next, the first insulating film 19, the circuit component portion 11, the substrate 10, and the adhesive layer 17b are etched in turn by a method such as reactive ion etching (RIE) using the mask layer 12 to form the through hole 13 in the substrate 10 to obtain a structure shown in FIG. 1D. Since the through hole 13 communicates with the opening 20a of the second supporting body 20 (for example, since centers of the through hole and the opening are aligned), the through hole 13 is not blocked by the supporting body 20. As a condition of RIE, $CF_4/O_2$ gas is used when the first insulating film 19 is a silicon nitride film, and silicon of the substrate 10 is etched with $SF_6/O_2$ gas (gas to be used: $SF_6$ 150 cc/$O_2$ 50 to 100 cc, pressure: 100 to 300 mTorr, RF power: 100 to 500 W). The silicon oxide film of the circuit component portion 11 and the adhesive layer 17b are etched with $CF_4/O_2$ gas.

As an etching temperature, a temperature at which the supporting body 18 is not peeled off is used, and etching is preferably performed at a temperature of 50 to 100° C. As for the size of the through hole 13, one side of a square, a diameter of a circle or a longer side of a rectangle may be 500 μm or less or 100 μm or less, if possible, 50 μm or less, or of the order of 1 to 10 μm.

7. Step of Forming Second Insulating Film

Figure 1E:
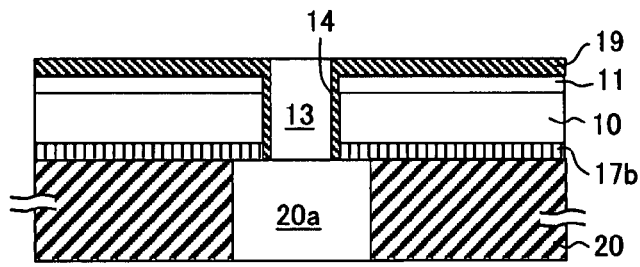
Figure 1F:
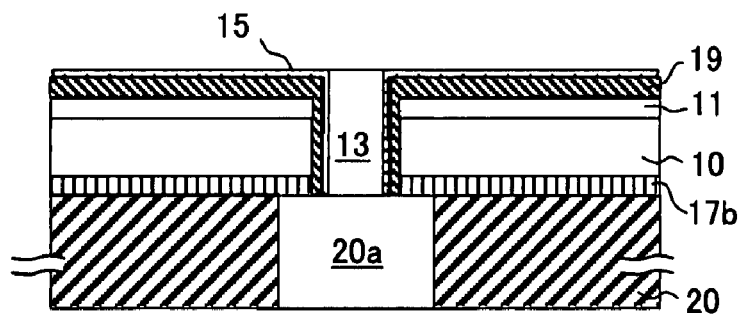

Next, the mask layer 12 is removed, and then the second insulating film 14 is formed within the through hole 13 (i.e., on the side wall of the through hole) to obtain a structure shown in FIG. 1E. The second insulating film 14 is formed so as to be about 100 to 200 nm in thickness when for example, one side of the through hole 13 is 10 μm. The second insulating film 14 is formed by a plasma CVD method, and the conditions of CVD are that temperature: 400° C., gas: TEOS 680 mg/$O_2$ 650 cc, pressure: 8.5 Torr, power: 800 W, and deposition rate: 100 to 200 nm/min. The plasma CVD is used because even a thin film by plasma CVD has good coverage and film quality is good. The second insulating film 14 is formed in a thickness of about 2 to 3 μm when one side of the through hole 13 is 100 μm. When the size of the through hole 13 is large, its surface area increases, and therefore a parasitic capacitance also increases. Therefore, the parasitic capacitance is reduced by thickening a film thickness. Further, in a solution of polyimide of about 150° C., a silicon substrate is used as an electrode to apply a voltage to deposit polyimide (that is, to electrocoat polyimide) on the surface of the substrate, and thereby the second insulating film 14 may be formed.

8. Step of Performing Copper Filling 8-1 Step of Forming Barrier Layer and Seed Layer Next, a copper seed layer 15 is formed, from the front side of the circuit component portion 11, on the front side of the substrate 10 and within the through hole 13 via a barrier layer hole to obtain a structure shown in FIG. 1F. The barrier layer is made of TiN or TaN, and is formed so as to be 5 to 150 nm, desirably 10 nm in thickness. The copper seed layer 15 is formed so as to be a thickness of a monoatomic layer to 200 nm in thickness, desirably 100 nm in thickness. Both of the barrier layer and the copper seed layer are formed by a CVD method, a sputtering method or the like. When the CVD method is employed, the TiN layer is grown at 150° C. by reacting $Ti(N(C_2H_5)_2)_4$ with $NH_3$ or $N_2$. The copper seed layer 15 is formed at 150° C. using Cu(hfac)(tmvs) as a raw material.

8-2 Step of Copper Plating

Figure 1G:
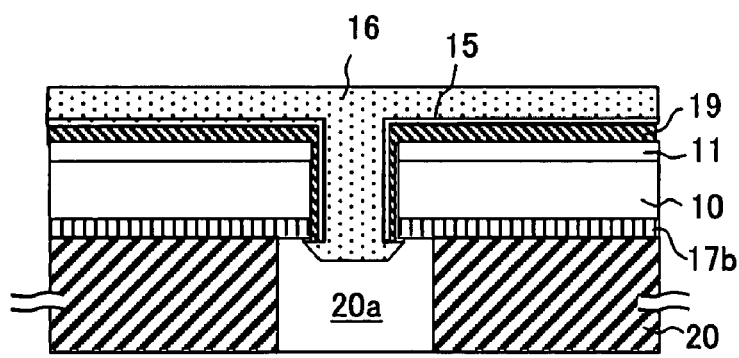

Next, copper 16 is filled into the through hole 13 by an electrolytic plating method by use of the copper seed layer 15 to obtain a structure shown in FIG. 1G. Since the second supporting body 20 has an opening 20a at the position of the through hole 13, a plating solution moves smoothly in the through hole 13. Accordingly, hydrogen bubbles produced by electrolysis and adhering to the surface of the through hole 13 are removed and the diffusion of a reaction species occurs efficiently, and therefore the formation of voids is inhibited and complete filling becomes possible. In order to perform the complete filling, copper plating is preferably performed until a thickness of plating on the surface of the substrate reaches a level of about 5 to 10 μm in consideration of variations. Here, copper plating is performed at 25° C. by an electrolytic plating under conditions $CuSO_4.5H_2O$, $H_2SO_4$ and $Cl^{-1}$ as a plating solution.

8-3 Step of CMP

Figure 1H:
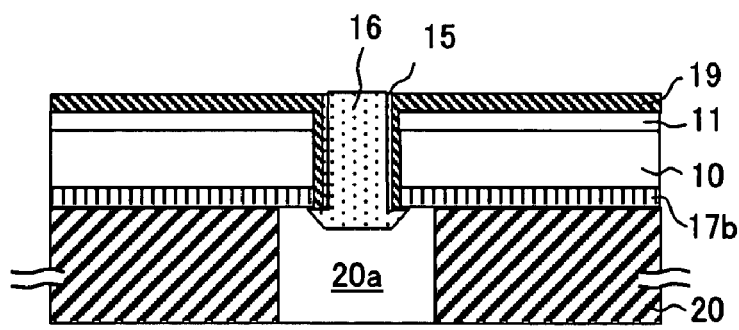

Next, the copper 16 on the first insulating film 19 is removed by a CMP method, and the copper 16 is left only in the through hole 13 to obtain a structure shown in FIG. 1H. In this example, since the copper 16 is formed on the first insulating film 19 and the first insulating film 19 is generally more flat than the backside of the substrate, the removal of the copper 16 by the CMP method is relatively easy.

9. Step of Removing Second Supporting Body

Figure 1I:
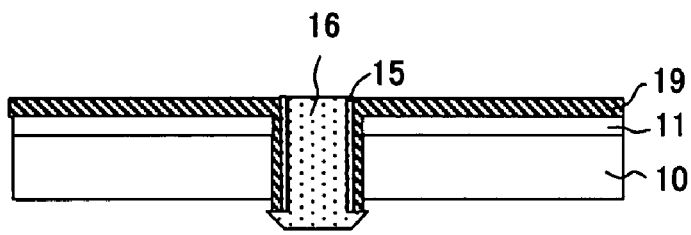

Next, the second supporting body 20 on the backside of the semiconductor substrate 10 is removed to obtain a structure shown in FIG. 1I. The removal of the second supporting body 20 is performed by immersing the substrate in a release solution such as monoethanolamine or dimethylformamide at about 120° C. to remove the adhesive layer 17b.

By undergoing the above-mentioned steps, a semiconductor device having a through-hole electrode is prepared.

EXAMPLE 2

FIG. 2 is a sectional view of a semiconductor device showing a production process of a semiconductor device of Example 2. Hereinafter, this example will be described by way of FIG. 2.

1. Step of Attaching First Supporting Body

Figure 2A:
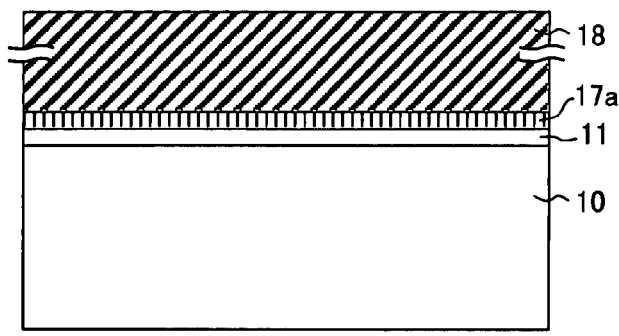
FIG. 2A to FIG. 2I are sectional views of a semiconductor device showing a production process of a semiconductor device of Example 2 of the present invention.

First, the first supporting body 18 is attached to the front side of the substrate 10 by the same method as in Example 1 to obtain a structure shown in FIG. 2A.

2. Step of Thinning Substrate

Figure 2B:
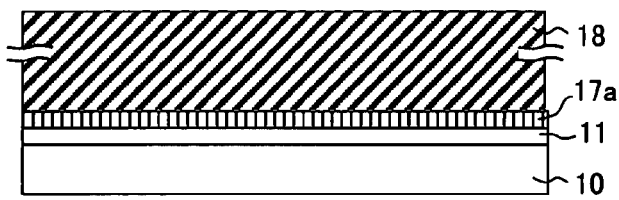

Next, the substrate 10 is thinned by the same method as in Example 1 to obtain a structure shown in FIG. 2B.

3. Step of Removing First Supporting Body

Next, the first supporting body 18 is removed from the substrate by the same method as in Example 1.

4. Step of Attaching Second Supporting Body

Next, the second supporting body 21 is attached to the back side of the substrate 10 by the same method as in Example 1.

In this example, the second supporting body 21 has an opening 21a having the same size as that of a through hole 13 to be formed in the substrate 10 since it is used as a mask for forming the through hole 13 in the substrate 10 in a subsequent step.

5. Step of Forming First Insulating Film

Figure 2C:
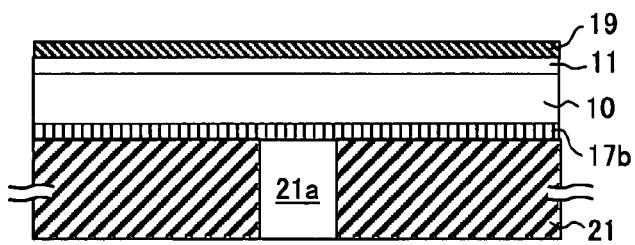

Next, the first insulating film 19 is formed on the front side of the substrate 10 by the same method as in Example 1 to obtain a structure shown in FIG. 2C.

6. Step of Forming Substrate Through Hole

Figure 2D:
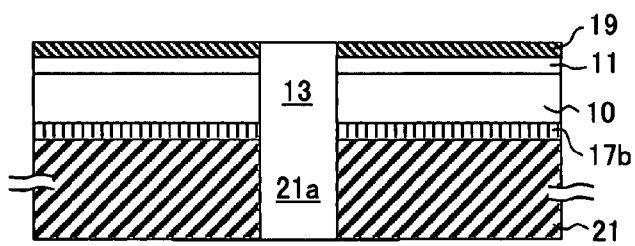

Next, the adhesive layer 17b, the substrate 10, the circuit component portion 11, and the first insulating film 19 are etched in turn by a method such as reactive ion etching (RIE) by use of the second supporting body 21 as a mask to form the through hole 13 in the substrate 10 to obtain a structure shown in FIG. 2D. The conditions of etching are the same as Example 1. In addition, in this step, the second supporting body 21 is also etched by a thickness of the substrate 10 (about 30 to 100 μm) plus over etching to decrease in the thickness, but this reduction in thickness does not matter as long as subsequent steps can be performed with the remaining thickness (a supporting body having a thickness allowing for the reduction in thickness is employed whenever necessary.).

7. Step of Forming Second Insulating Film

Figure 2E:
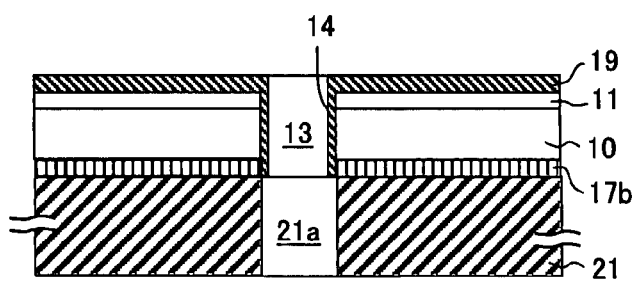
Figure 2F:
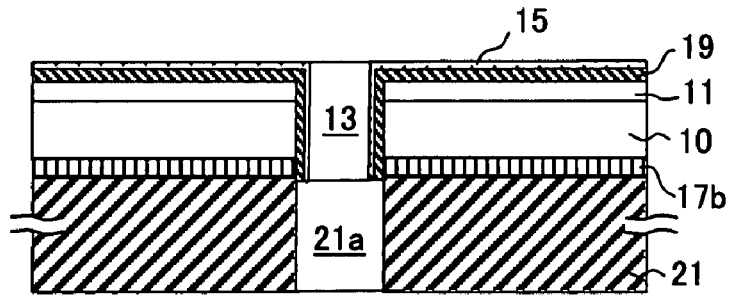
Figure 2G:
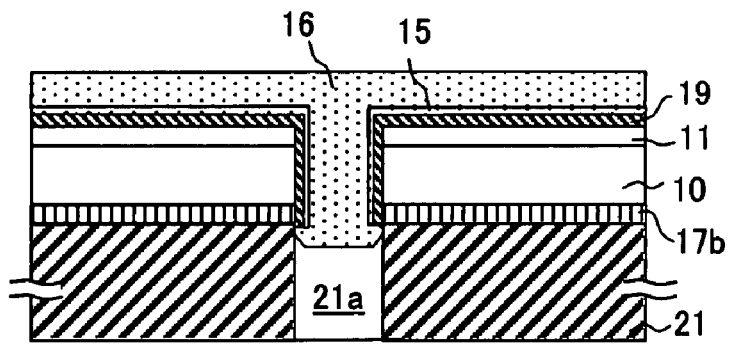
Figure 2H:
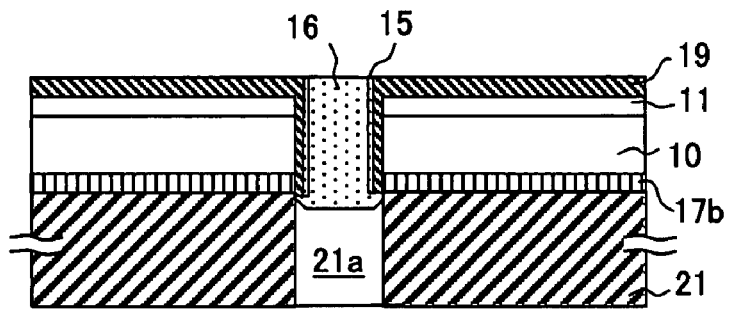

Next, the second insulating film 14 is formed within the through hole 13 by the same method as in Example 1 to obtain a structure shown in FIG. 2E.

8. Step of Performing Copper Filling

Next, the copper seed layer 15 is formed via a barrier layer (FIG. 2F), the copper 16 is filled into the through hole 13 by an electrolytic plating method (FIG. 2G), and unnecessary copper is removed by a CMP method (FIG. 2H) by the same method as in Example 1.

9. Step of Removing Second Supporting Body

Figure 2I:
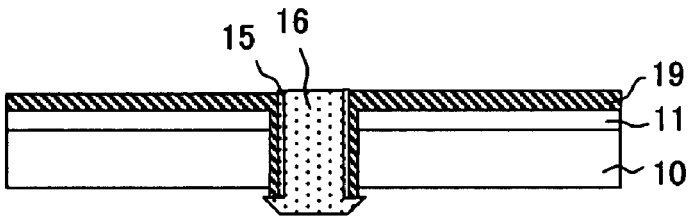

Next, the second supporting body 21 is removed by the same method as in Example 1 to obtain a structure shown in FIG. 2I.

In accordance with the method of producing the semiconductor device having this structure, since a through-hole electrode pattern can be formed in the substrate by use of the second supporting body 21 as a mask, it is possible to reduce number of masks and the photolithography, and therefore to shorten a TAT (turn around time, time between an order and delivery) and reduce the cost.

EXAMPLE 3

FIG. 3 is a sectional view of a semiconductor device showing a production process of a semiconductor device of Example 3. Hereinafter, this example will be described by way of FIG. 3.

1. Step of Attaching First Supporting Body

Figure 3A:
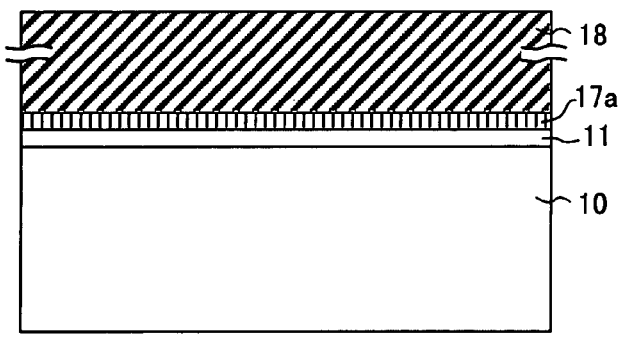
FIG. 3A to FIG. 3J are sectional views of a semiconductor device showing a production process of a semiconductor device of Example 3 of the present invention.

First, the first supporting body 18 is attached to the front side of the substrate 10 by the same method as in Example 1 to obtain a structure shown in FIG. 3A.

2. Step of Thinning Substrate

Figure 3B:
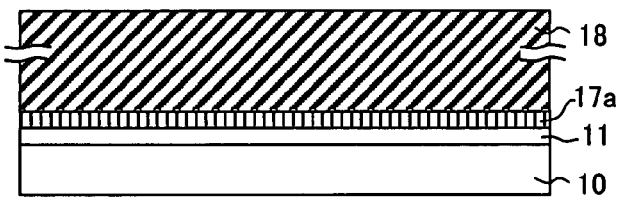

Next, the substrate 10 is thinned by the same method as in Example 1 to obtain a structure shown in FIG. 3B.

3. Step of Removing First Supporting Body

Next, the first supporting body 18 is removed from the substrate by the same method as in Example 1.

4. Step of Attaching Second Supporting Body

Next, the second supporting body 22 is attached to the back side of the substrate 10 by the same method as in Example 1.

In this example, the second supporting body 22 has an opening 22a having the same size as that of a groove 23 formed since it is used as a mask for forming the groove 23 in the substrate 10 in a subsequent step.

5. Step of Forming First Insulating Film

Figure 3C:
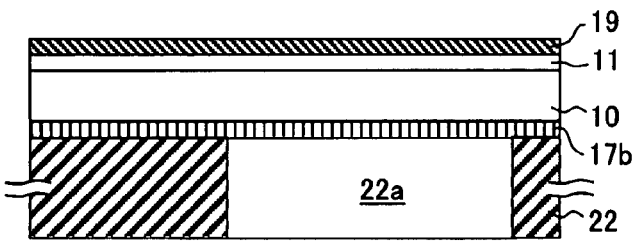

Next, the first insulating film 19 is formed on the front side of the substrate 10 by the same method as in Example 1 to obtain a structure shown in FIG. 3C.

6. Step of Forming Substrate Through Hole

Figure 3D:
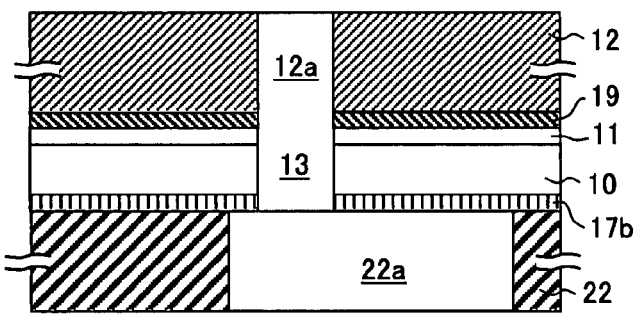

Next, the through hole 13 is formed in the substrate 10 by the same method as in Example 1 to obtain a structure shown in FIG. 3D.

7. Step of Forming Groove

Figure 3E:
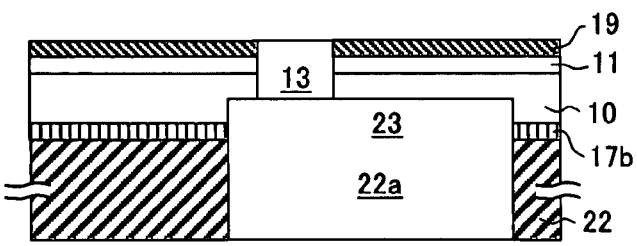

Next, the groove 23 is formed on the backside of the substrate by etching the substrate from the backside by use of the second supporting body 22 as a mask to obtain a structure shown in FIG. 3E. Further, the groove may be formed by forming a resist pattern on the backside of the substrate by a photolithography technique using the second supporting body having an opening larger than a groove to be formed, and using this resist pattern as a mask.

8. Step of Forming Second Insulating Film

Figure 3F:
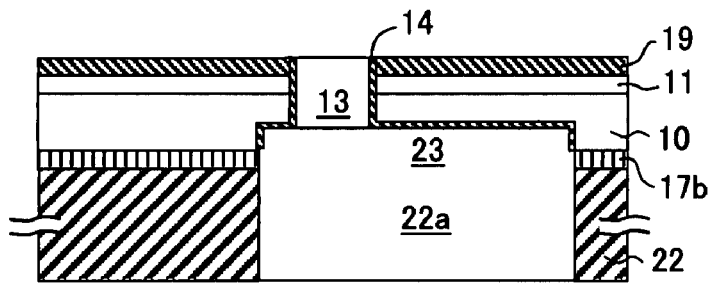
Figure 3G:
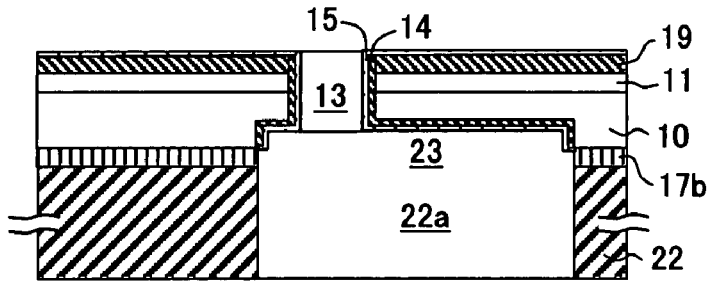
Figure 3H:
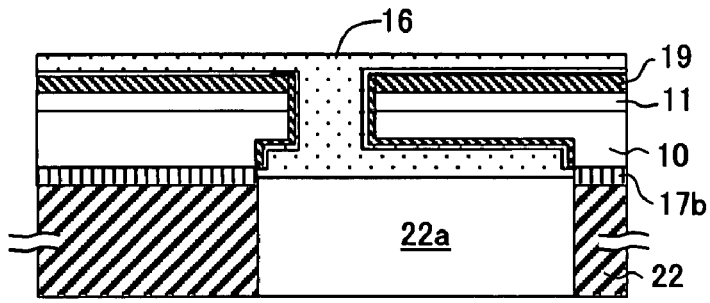

Next, the second insulating film 14 is formed within the groove 23 and the through hole 13 by the same method as in Example 1 to obtain a structure shown in FIG. 3F.

9. Step of Performing Copper Filling

Next, the copper seed layer 15 is formed via a barrier layer (FIG. 3G), the copper 16 is filled into the through hole 13 by an electrolytic plating method (FIG. 3H), and unnecessary copper is removed by a CMP method (FIG. 3I) by the same method as in Example 1. The removal of the copper on the backside by the CMP method is performed under a pressure (for example, 20 kPa or less) of the level at which the second supporting body 22 is not peeled off.

10. Step of Removing Second Supporting Body

Figure 3I:
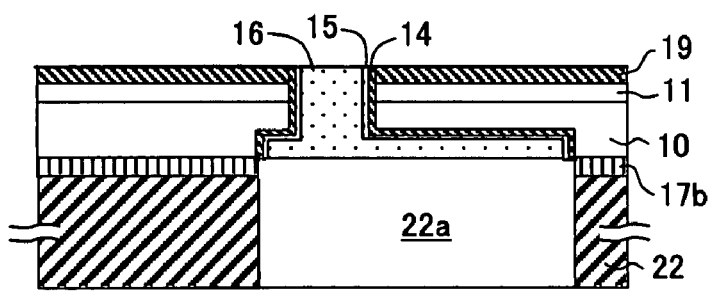
Figure 3J:
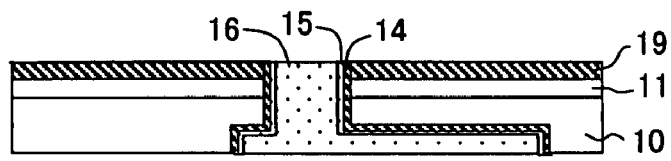

Next, the second supporting body 22 is removed by the same method as in Example 1 to obtain a structure shown in FIG. 3I.

In accordance with the method of producing the semiconductor device having this structure, it is possible to simultaneously form a groove wiring and the through-hole electrode.

EXAMPLE 4

FIG. 4 is a sectional view of a semiconductor device showing a production process of a semiconductor device of Example 4. Hereinafter, this example will be described by way of FIG. 4.

This example is the same as Example 1, but different from Example 1 in that the circuit component portion 11 formed on the substrate 10 includes the wiring layer 11a and the wiring layer 11a is provided next to sites where the through hole 13 is to be formed. The wiring layer 11a is generally electrically connected to various circuit components in the circuit component portion 11.

1. Step of Attaching First Supporting Body to Step of Forming First Insulating Film First, the steps of from attaching a first supporting body to forming a first insulating film are performed by the same method as in Example 1 to obtain a structure shown in FIG. 4A. As described above, in this example, the circuit component portion 11 includes the wiring layer 11a.

2. Step of Forming Substrate Through Hole

Next, the photoresist layer is formed by applying a photoresist onto the first insulating film 19 on the front side of the substrate 10, and the mask layer 12 having an opening 12a is formed by patterning this photoresist layer. In this embodiment, a opening 12a which is larger than the through hole 13 to be formed in the substrate 10 is used as shown in FIG. 4B.

Figure 4A:
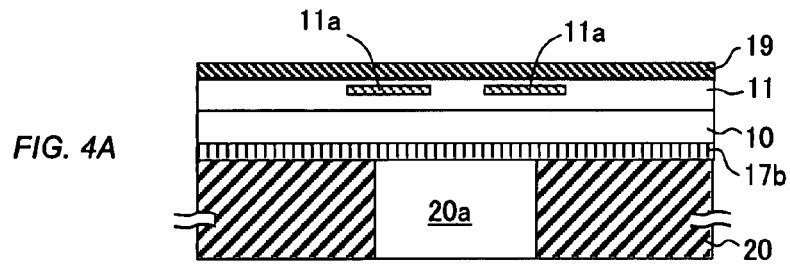
FIG. 4A to FIG. 4G are sectional views of a semiconductor device showing a production process of a semiconductor device of Example 4 of the present invention.
Figure 4B:
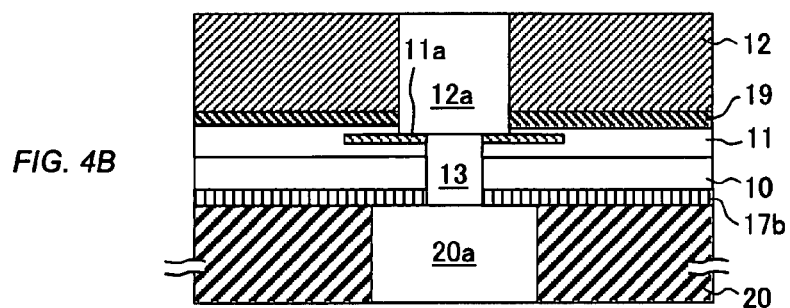

Next, the first insulating film 19, the circuit component portion 11, the substrate 10, and the adhesive layer 17b are etched in turn by a method such as reactive ion etching (RIE) using the mask layer 12 to form the through hole 13 in the substrate 10 to obtain a structure shown in FIG. 4B. The above-mentioned etching is performed in the condition that the wiring layer 11a becomes a stopper layer. Therefore, the size of the through hole 13 is determined by an arrangement of the wiring layer 11a, and the size of the through hole 13 becomes smaller than the opening 12a of the mask layer 12.

3. Step of Forming Second Insulating Film

Figure 4C:
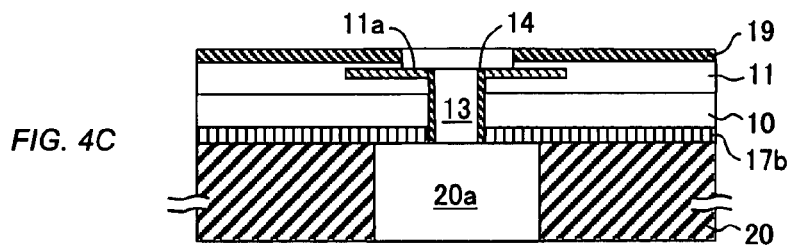
Figure 4D:
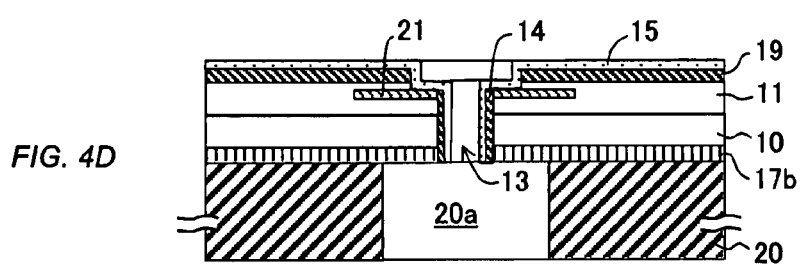
Figure 4E:
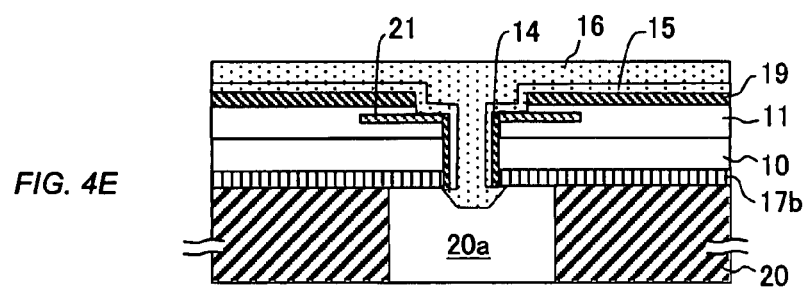
Figure 4F:
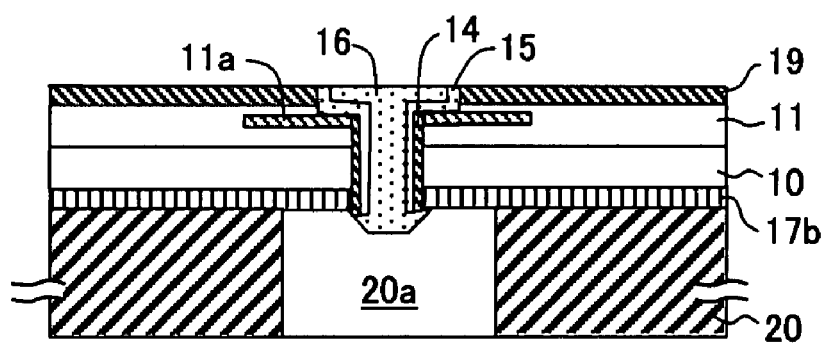

Next, the second insulating film 14 is formed within the through hole 13 by the same method as in Example 1 to obtain a structure shown in FIG. 4C.

4. Step of Performing Copper Filling

Next, the copper seed layer 15 is formed via a barrier layer (FIG. 4D), the copper 16 is filled into the through hole 13 by an electrolytic plating method (FIG. 4E), and unnecessary copper is removed by a CMP method (FIG. 4F) by the same method as in Example 1.

6. Step of Removing Second Supporting Body

Figure 4G:
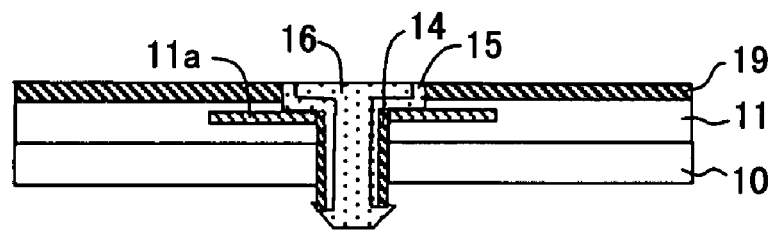

Next, the second supporting body 21 is removed by the same method as in Example 1 to obtain a structure shown in FIG. 4G.

In accordance with this example, a semiconductor device having a through-hole electrode electrically connected to a wiring layer 11a can be easily prepared.

(Configurations of Supporting Bodies Used in the Above-Mentioned Examples and Substrates Obtained in these Examples)

In FIG. 5, shapes of device wafer (substrate in which a through hole is formed) 24 and second supporting bodies 20, 21 are shown. FIG. 5A shows a device wafer 24 and FIG. 5B is a device chip 24a denoted by enlarging a piece of the device wafer 24 and has a pattern of the through hole 25. In FIG. 5C, second supporting bodies 20, 21 are shown, and FIG. 5D is an enlarged view of an area 26 corresponding to the device chip 24a and has an opening 27 corresponding to a pattern of the through hole 25. Since the opening 27 also serves as a mask for forming the through hole 25 in the substrate in the case of the second supporting body used in Example 2, the opening 27 has the same size as the through hole 25. The opening 27 of the second supporting body of Example 1 desirably has a size which is larger by several microns than the through hole 25. And, a pattern of the opening 27 of the second supporting body used in Example 1 may be a pattern like an opening 28 covers the through holes 25 collectively as shown in FIG. 5E. Patterns other than illustrated patterns may be used as long as the pattern has a shape of not interfering with the supply of a plating solution in electrolytic plating while maintaining a wafer-supporting function as a second supporting body.

(Lamination Type Semiconductor Devices Using Semiconductor Devices Obtained in the Above-Mentioned Examples)

Figure 6A:
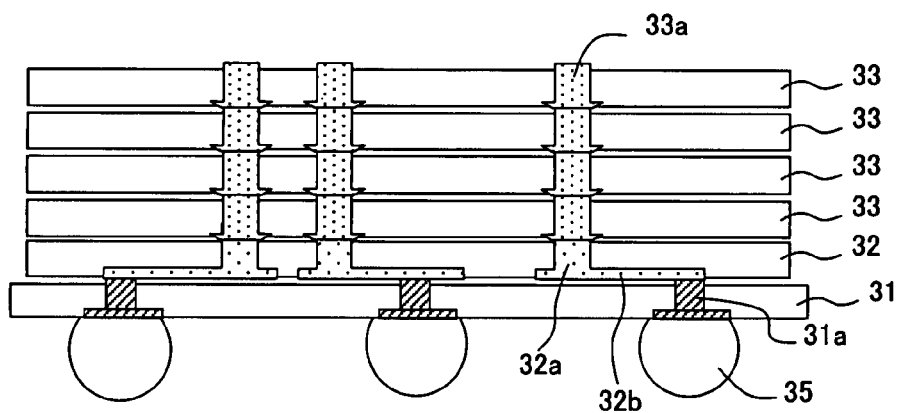
FIG. 6A and FIG. 6B are views of lamination type semiconductor devices using semiconductor devices obtained in Examples 1 to 4, and are a sectional view and a bottom view, respectively.
Figure 6B:
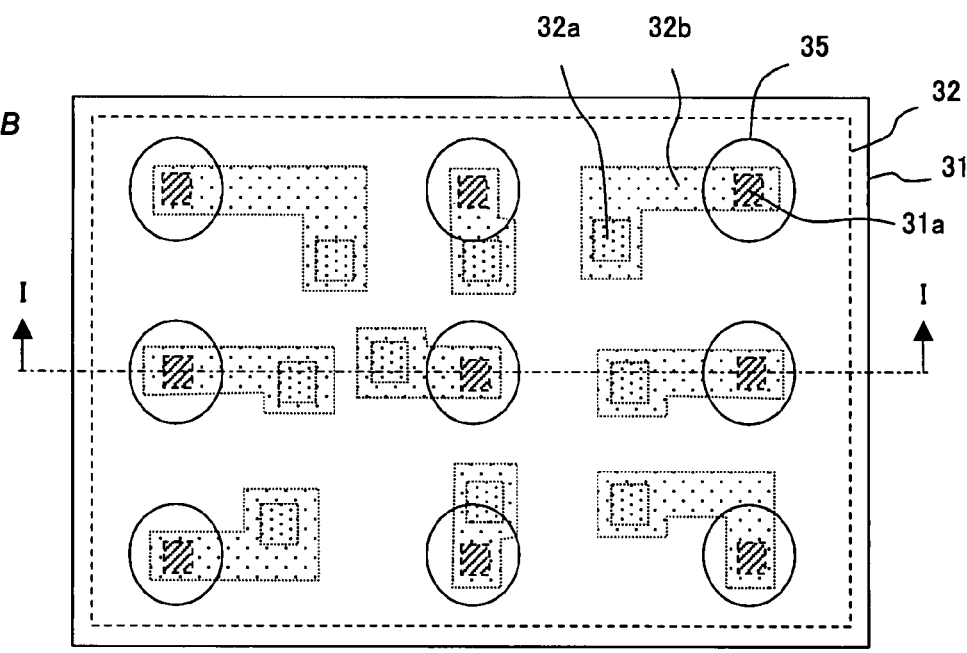

In FIG. 6, lamination type semiconductor devices using semiconductor devices having a through-hole electrode obtained in Examples 1 to 4 are shown. FIG. 6B is a bottom view of this device and FIG. 6A is a sectional view taken on line I-I of FIG. 6B. This device includes a semiconductor device 32 having the through-hole electrode 32a and the groove wiring (width 10 to 200 µm) 32b, obtained in Example 3, on an interposer 31 and a semiconductor device 33 having the through-hole electrode 33a obtained in Example 1, 2 or 4. Four semiconductor devices 33 are stacked. The interposer 31 includes a bump ball (diameter 30 to 200 µm) 35 on the backside and has a through-hole electrode (diameter 10 to 100 µm) 31a in the interposer.

The through-hole electrodes 32a, 33a of the respective semiconductor devices 32, 33 are electrically connected to each other, and further, the groove wiring 32b, the through-hole electrode 31a in the interposer and the bump ball 35 are also electrically connected to one another. Therefore, by employing the constitution like FIG. 6, a lamination type semiconductor device, in which semiconductor devices in all layers are electrically connected to the bump ball on the backside of the interposer 31 without using wiring, can be obtained.

The invention claimed is:

1. A semiconductor device, comprising:
   a circuit component portion formed on a front side of a substrate;
   a through hole piercing the substrate and the circuit component portion;
   an insulating film formed on a side face of the through hole and on a front side of the circuit component portion; and
   a conductive layer filled in the through hole to extend from a backside of the substrate to the front side of the circuit component portion,
   wherein the conductive layer and the insulating film protrude from a backside of the semiconductor device so as to insulate the conductive layer from other areas of the backside of the semiconductor device.

2. The device of claim 1, wherein the substrate has a thickness of 30 to 100 µm.

3. The device of claim 1, wherein the conductive layer is made of a conductor seed layer and a conductor filled by an electrolytic plating method using this seed layer.

4. The device of claim 3, wherein the conductor seed layer has a thickness between a thickness of a monoatomic layer and 200 nm.

5. The device of claim 3, wherein the conductor seed layer is formed within the through hole via a barrier layer.

6. The device of claim 5, wherein the barrier layer is made of TiN or TaN.

7. The device of claim 1, wherein the circuit component portion comprises a wiring layer inside, the through hole is formed so as to expose the wiring layer, and the conductive layer is formed so as to be connected to the wiring layer.

8. The device of claim 1, wherein the conductive layer protrudes from the backside of the substrate to a larger extent than the insulating film formed on the side face of the through hole.

9. A lamination semiconductor device, comprising:
   an interposer having a bump ball on the backside and a through-hole electrode inside; and
   a plurality of semiconductor devices laminated on the interposer;
   wherein the plurality of semiconductor devices are the devices of claim 1.

10. The device of claim 1, wherein a diameter of the through hole formed in the substrate and the circuit component portion is constant throughout an entire depth of the substrate and the circuit component portion.

11. The device of claim 1, wherein the insulating film is not formed on the backside of the substrate.

12. The device of claim 1, wherein the front sides of the conductive layer and the insulating film are coplanar.

13. The device of claim 1, wherein the insulating film on the side face of the through hole contacts the circuit component portion and the substrate.

14. A semiconductor device, comprising:
   a circuit component portion formed on a front side of a substrate;
   a through hole piercing the substrate and the circuit component portion;
   a groove formed on a backside of the substrate, elongated in parallel with the backside, and communicating with the through hole;
   an insulating film formed on a side face of the through hole, on a front side of the circuit component portion and on an inner face of the groove;
   a conductive layer filled in the through hole to extend from the backside of the substrate to the front side of the circuit component portion; and
   an elongated groove wiring filled in the groove.

15. The device of claim 14, wherein backsides of the substrate and the groove wiring are coplanar.

16. The device of claim 14, wherein the insulating film is not formed on the backside of the substrate outside of the groove wiring.

17. The device of claim 14, wherein the front sides of the conductive layer and the insulating film are coplanar.

18. The device of claim 14, wherein the elongated groove wiring is rectangular in shape.

19. The device of claim 14, wherein the insulating film on the side face of the through hole contacts the circuit component portion and the substrate.

* * * * *